United States Patent [19]

West

[11] Patent Number: 4,497,998

[45] Date of Patent: Feb. 5, 1985

[54] TEMPERATURE STABILIZED STOP-RESTART OSCILLATOR

[75] Inventor: Burnell G. West, Fremont, Calif.

[73] Assignee: Fairchild Camera and Instrument Corp., San Jose, Calif.

[21] Appl. No.: 452,606

[22] Filed: Dec. 23, 1982

[51] Int. Cl.³ .............................................. H05B 1/00
[52] U.S. Cl. .................................... 219/210; 219/209
[58] Field of Search ................ 219/209, 210, 497, 501

[56] References Cited

U.S. PATENT DOCUMENTS

| | | | |
|---|---|---|---|
| 3,308,271 | 3/1967 | Hilbiber | 219/501 |
| 3,320,407 | 5/1967 | Holmes | 219/210 |
| 3,393,870 | 7/1968 | Jeffrey | 219/501 |
| 3,395,265 | 7/1968 | Weir | 219/501 |
| 3,431,392 | 3/1969 | Garland | 219/210 |
| 3,719,797 | 3/1973 | Andrews | 219/501 |
| 3,818,254 | 6/1974 | Persson | 219/501 |
| 3,887,785 | 6/1975 | Ahlport | 219/210 |
| 4,157,466 | 6/1979 | Herrin | 219/210 |
| 4,317,985 | 3/1982 | Wilson | 219/497 |

OTHER PUBLICATIONS

Reilly, D. F. and J. F. Prosser, "Self-Contained Chip Heater", *IBM Tech. Disc. Bull.*, vol. 14, No. 6, Nov. 1971, p. 1770.

*Primary Examiner*—Roy N. Envall, Jr.
*Assistant Examiner*—Teresa J. Walberg
*Attorney, Agent, or Firm*—Theodore S. Park; Robert C. Colwell

[57] ABSTRACT

A closed loop integrated circuit temperature stabilizer 10 has an on-chip temperature sensor 12 for supplying a voltage indication of temperature to an op amp 22 which maintains chip temperature equilibrium by controlling a load transistor 30 which draws current through on-chip heating means 16.

4 Claims, 1 Drawing Figure

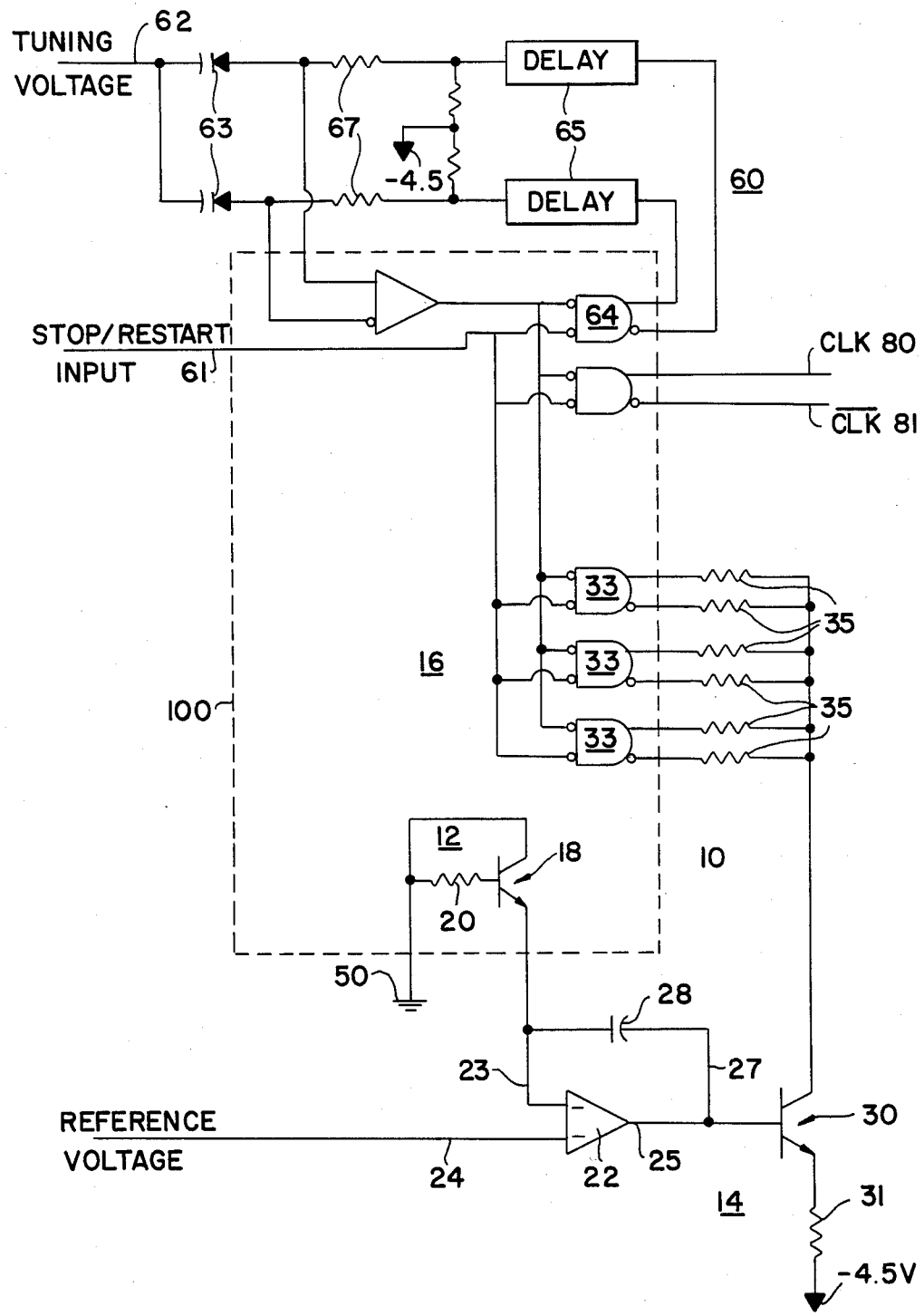

TEMPERATURE STABILIZED STOP-RESTART OSCILLATOR

BACKGROUND OF THE INVENTION

1. Field of the Invention

This invention relates to a temperature stabilization circuit and more particularly to such a circuit used for stabilizing an inverting gate ring oscillator.

2. Description of the Prior Art

Time base oscillators are needed in integrated circuit test systems to measure time intervals starting precisely from irregularly occurring external events. The most common prior art test system oscillators are phase locked. The frequency deviations that inevitably occur when a phase locked oscillator is unlocked for synchronous restarting introduce unsatisfactory errors. Stop-restart inverting gate ring oscillators have not often been used in test systems to provide time base signals because of such oscillator's high temperature dependence. To be sufficiently accurate, stop-restart oscillators need to operate at a stabilized temperature. Attempts have been made to temperature stabilize them in several ways, including heating the oscillator in a "constant" temperature oven, but prior art techniques have not provided sufficiently accurate control over the temperature and frequency.

SUMMARY OF THE INVENTION

This invention provides an oscillator which is able to measure time intervals more precisely from irregularly occurring external events, which has high frequency stability, and which is temperature independent over a relatively wide range of temperatures.

In one embodiment the invention comprises a temperature stabilizer which is integrated into an integrated circuit with a conventional stop-restart oscillator. A temperature sensor, located on the chip with the key inverting element of the oscillator, is used as the feedback source element in a continuous closed loop temperature control mechanism. The oscillator is frequency stabilized by periodically applying corrections, which are held fixed while the oscillator is stopped and restarted. The frequency at restart time is more accurate than in a phase locked oscillator.

The principle problem in maintaining constant frequency is to control the temperature of the oscillator well enough so that it will not drift out of tolerance. Integrating both the temperature sensor and the heating means into the same chip with the oscillator circuit, rather than using a large "constant" temperature oven, makes possible more accurate measurement of local temperature and faster and more closely controlled heating response at lower cost.

BRIEF DESCRIPTION OF THE DRAWING

The FIGURE shows a temperature sensor incorporated with an inverting element and logic gates in a chip used for a stop-restart oscillator.

DETAILED DESCRIPTION OF THE PREFERRED EMBODIMENT

Referring to the FIGURE, in one embodiment this invention is an integrated temperature stabilizing circuit 10 which is shown used in an intermittently frequency corrected oscillator. Such oscillators may be used as timing sources in systems for automatically testing integrated circuits. However, it should be understood that the temperature stabilizer could be used in any heat-sensitive integrated circuit device.

The temperature stabilizer 10 comprises temperature sensor means 12, heating control means 14, and heating means 16. The temperature sensor 12 includes a p-n junction such as in bipolar transistor 18 which has its collector, and through resistor 20, is base, connected to an external ground. A temperature variable resistor or diode could be used in place of transistor 18. The voltage drop across a bipolar transistor in such a circuit depends on the current drawn through it and its temperature, and the drop will generally be about minus 1½ to 2 millivolts per increased degree centigrade. A fixed current drawn through a transistor gives a very consistent voltage indication of the temperature of the transistor and hence the temperature of the integrated circuit in which it is fabricated.

The voltage difference from the collector to the emitter of transistor 18 decreases as the chip 100 gets warmer. As this voltage difference decreases, that is, as the voltage becomes less negative with respect to ground, and the emitter voltage is applied to the negative input 23 of op amp 22, the voltage at op amp output 25 is driven lower. Op amp 22 will cause transistor 30 to draw an appropriate current through heating means 16, which may be spare gates 33, to correct the temperature of the chip. As the op amp output 25 voltage is lowered, emitter follower load transistor 30, which has a relatively high beta, will not draw as much current. Resistor 31 typically will have a resistance in the range of five to twenty ohms, but the value is not critical. The smaller current drawn through heating means 16 will reduce the heat created by heating means 16 and the temperature of chip 100 will fall. Resistors 35 typically will have values in the range of ten to fifty ohms, but their resistance is not critical as they merely provide an output impedance for the embodiment using gates 33. Alternate heating means could be used, in which case an alternate voltage supply for the heating means would be provided to avoid affecting the signal on input line 61. Resistors 35 may not be necessary if alternate heating means are used.

Capacitor 28 in feedback circuit 27 corrects the amplitude and phase of the feedback signal to damp oscillations caused by the thermal response time (inertia) of chip 100 and the substrate on which it is mounted. The capacitance of capacitor 28 will be selected to suit the thermal characteristics of the integrated circuit package surrounding the chip. In the preferred embodiment capacitor 28 is 1 microfarad.

A digital to analog converter (DAC) external to the oscillator chip, or any other suitable voltage source, is used to provide a center or reference voltage to input 24 of operational amplifier 22. Because at the time of manufacture, it is difficult to know precisely what the normal operating temperature of the circuit will be, it is difficult to design the circuit to compensate for variations in operating temperature. Therefore the operating reference voltage is adjusted by the external DAC, while the oscillator is operating at its normal temperature. In this oscillator circuit the most significant contribution to frequency shift is the temperature of the chip. There is some temperature contribution from other elements in the circuit, but those contributions are relatively small and can be otherwise compensated. Using the components shown, the temperature of the chip may be maintained within 0.1 degrees of normal, over a two volt operating range at op amp output 25. After the temperature of the chip is stabilized, the oscillator frequency is adjusted by whatever means is appropriate, for example, as described below.

In this embodiment, an additional DAC may be used to control the frequency by changing the tuning voltage at input 62 to voltage dependent capacitors 63. Changing their capacitance changes the loop time and therefore the frequency of the oscillator. Signals from gate 64 feed back through delay lines 65. Most of the oscillator period is due to propagation delay through the oscillator chip 100 and the delay lines 65. The remaining delay results from delay through the network which consists of voltage-dependent capacitors 63 and resistors 67. This is a conventional way of handling frequency control. There are true and complementary clock outputs at terminals 80 and 81.

While the above is a description of the preferred embodiment of the present invention, various modifications and equivalents may be employed without departing from the spirit and scope of the invention. Therefore, the above description should not be taken as limiting the scope of the invention, which is defined by the appended claims.

I claim:

1. A temperature stabilized oscillator comprising:
   an oscillator for generating a clock signal;
   a gate connected to the oscillator for switchably connecting the clock signal from the oscillator to at least one output terminal, the gate being fabricated in an integrated circuit;
   at least one additional gate for heating the integrated circuit connected between the oscillator and a first node, each of the at least one additional gate being also fabricated in the integrated circuit;
   a temperature sensor disposed in the integrated circuit for producing signals varying in response to variations in temperature of the integrated circuit; and
   a control circuit coupled to the temperature sensor, the first node, and a source of electrical potential, for controlling operation of each of the at least one additional gate in response to the signals from the temperature sensor.

2. Apparatus in claim 1 wherein the temperature sensor comprises:
   a ground terminal; and
   a bipolar transistor having a base and a collector coupled to the ground terminal and a emitter connected to a second node.

3. Apparatus as in claim 2 wherein the control circuit comprises:
   a reference voltage supply;
   an operational amplifier having a positive input terminal connected to the voltage supply and a negative input terminal connected to the second node;
   a capacitor connected between the second node and an output terminal of the operational amplifier; and
   a bipolar transistor having a base connected to the output terminal of the operational amplifier, a collector connected to the first node, and an emitter connected to the source of electrical potential.

4. Apparatus as in claim 3 wherein the oscillator comprises a ring oscillator.

* * * * *